United States Patent
Li et al.

(10) Patent No.: US 12,256,538 B2
(45) Date of Patent: Mar. 18, 2025

(54) ANTI-FUSE UNIT STRUCTURE AND ANTI-FUSE ARRAY

(71) Applicant: CHANGXIN MEMORY TECHNOLOGIES, INC., Anhui (CN)

(72) Inventors: Xiong Li, Hefei (CN); Peng Feng, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 692 days.

(21) Appl. No.: 17/310,859

(22) PCT Filed: Mar. 18, 2021

(86) PCT No.: PCT/CN2021/081498
§ 371 (c)(1),
(2) Date: Aug. 26, 2021

(87) PCT Pub. No.: WO2021/203937
PCT Pub. Date: Oct. 14, 2021

(65) Prior Publication Data
US 2022/0320121 A1    Oct. 6, 2022

(30) Foreign Application Priority Data
Apr. 7, 2020  (CN) .......................... 202010264022.4

(51) Int. Cl.
*H10B 20/20*    (2023.01)
*H10B 20/25*    (2023.01)

(52) U.S. Cl.
CPC .................................. *H10B 20/25* (2023.02)

(58) Field of Classification Search
CPC ........ H10B 20/20; H10B 12/30; H10B 20/25; H01L 23/525; H01L 23/5252; H01L 27/0688
See application file for complete search history.

(56) References Cited

U.S. PATENT DOCUMENTS 6,630,724 B1    10/2003  Marr
9,543,309 B2    1/2017   Park
(Continued)

FOREIGN PATENT DOCUMENTS

| | | |
|---|---|---|
| CN | 104240762 A | 12/2014 |
| EP | 3196936 B1 | 4/2020 |
| KR | 20090103613 A | 10/2009 |

OTHER PUBLICATIONS

CN first office action in application No. 202010264022.4, mailed on May 24, 2023.
(Continued)

*Primary Examiner* — Jerome Leboeuf
(74) *Attorney, Agent, or Firm* — Syncoda LLC; Feng Ma

(57) ABSTRACT

An anti-fuse unit structure includes a substrate, an anti-fuse device, and a select transistor. The anti-fuse device is formed in the substrate and comprises a first gate structure, a first source doped region, and a first drain doped region, wherein the first gate structure is electrically connected to the first drain doped region. The select transistor is formed in the substrate and matched with the anti-fuse device, and comprises a second gate structure, a second source doped region and a second drain doped region, wherein the second drain doped region is electrically connected to the first source doped region.

17 Claims, 3 Drawing Sheets

(56) References Cited

U.S. PATENT DOCUMENTS

| | | | |
|---|---|---|---|
| 9,589,971 B1* | 3/2017 | Chang | H01L 29/1083 |
| 9,953,685 B2 | 4/2018 | Kuo et al. | |
| 2010/0165699 A1 | 7/2010 | Chen et al. | |
| 2012/0051164 A1 | 3/2012 | Son et al. | |
| 2015/0062998 A1* | 3/2015 | Nam | H10B 20/20 |
| | | | 365/96 |
| 2016/0005882 A1 | 1/2016 | Kwon | |
| 2017/0316835 A1* | 11/2017 | Liaw | H01L 29/94 |
| 2020/0083236 A1 | 3/2020 | Wang et al. | |
| 2020/0091161 A1 | 3/2020 | Cheng et al. | |
| 2021/0249422 A1* | 8/2021 | Chang | H01L 27/0207 |
| 2022/0045073 A1* | 2/2022 | Huang | H01L 23/5252 |

OTHER PUBLICATIONS

International Search Report in Application No. PCT/CN2021/081498 mailed on Jun. 17, 2021.

* cited by examiner

ANTI-FUSE UNIT STRUCTURE AND ANTI-FUSE ARRAY

CROSS-REFERENCE TO RELATED APPLICATIONS

This application is a national stage of International Application No. PCT/CN2021/081498 filed on Mar. 18, 2021, which claims priority to Chinese Patent Application No. 202010264022. filed on Apr. 7, 2020. The disclosures of these applications are hereby which is-incorporated herein by reference in its their entirety.

TECHNICAL FIELD

The present disclosure relates to an anti-fuse unit structure and an anti-fuse array.

BACKGROUND

Anti-fuse storage units are widely used in DRAM (Dynamic Random-Access Memory) circuits for repair work. The gate oxide anti-fuse storage units, as typical representatives, connect anti-fuse devices in series with other transistors to perform complex reading and writing tasks.

Traditional anti-fuse devices use thin gate oxide, and transistors connected in series to the anti-fuse devices use thick gate oxide (that is, the thickness of the gate dielectric layer in a single anti-fuse transistor is less than the thickness of the gate dielectric layer in a transistor connected in series thereto).

SUMMARY

According to various embodiments, a first aspect of the present disclosure provides an anti-fuse unit structure, comprising:
  a substrate;
  an anti-fuse device, formed in the substrate, comprising a first gate structure, a first source doped region, and a first drain doped region, wherein the first gate structure is electrically connected to the first drain doped region; and
  a select transistor, formed in the substrate and matched with the anti-fuse device, comprising a second gate structure, a second source doped region and a second drain doped region, wherein the second drain doped region is electrically connected to the first source doped region.

According to various embodiments, a second aspect of the present disclosure provides an anti-fuse array. The anti-fuse array comprises a plurality of anti-fuse unit combinations arranged in an array, each of the anti-fuse unit combinations comprising two symmetrically arranged anti-fuse unit structures, wherein the anti-fuse unit structure is the anti-fuse unit structure described in any of the above embodiments.

The details of one or more embodiments of the present disclosure will be set forth in the following drawings and description. Other features and advantages of the present application will become apparent from the description, drawings and claims.

BRIEF DESCRIPTION OF THE DRAWINGS

In order to explain technical solutions of embodiments of the present application more clearly, the accompanying drawings to be used in the embodiments will be introduced simply. Apparently, the accompanying drawings to be described below are merely some embodiments of the present application. A person of ordinary skill in the art may obtain other drawings according to these drawings without paying any creative effort.

DETAILED DESCRIPTION

Due to the restriction of design rules between gate dielectric layers of different thicknesses (usually made of a silicon oxide material, so called gate oxide layer), the distance between the anti-fuse device and the transistor connected in series thereto is too large, which is not conducive to the reduction in the size of the anti-fuse unit structure. In addition, the process stability of the thin gate oxide is worse than that of the thick gate oxide, resulting in unstable programming voltage of the thin gate oxide and poor resistance convergence after programming, which eventually causes the programming voltage of the anti-fuse device to be unstable.

In order to make the above objectives, features and advantages of the present disclosure more obvious and understandable, the specific implementations of the present disclosure will be described in detail below with reference to the accompanying drawings. In the following description, many specific details are provided in order to fully understand the present disclosure. However, the present disclosure may be implemented in many other ways different from those described herein, and those skilled in the art can make similar improvements without departing from the spirit of the present disclosure. Therefore, the present disclosure is not limited by the specific implementations disclosed below.

Figure 1:
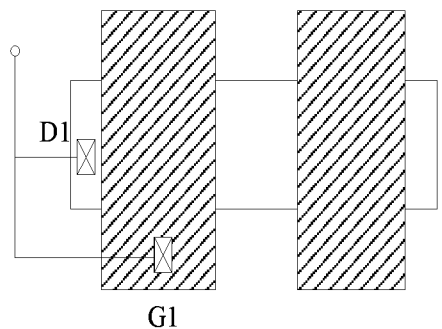
FIG. 1 is a schematic cross-sectional structure view of an anti-fuse unit structure according to an embodiment of the present disclosure.
Figure 2:
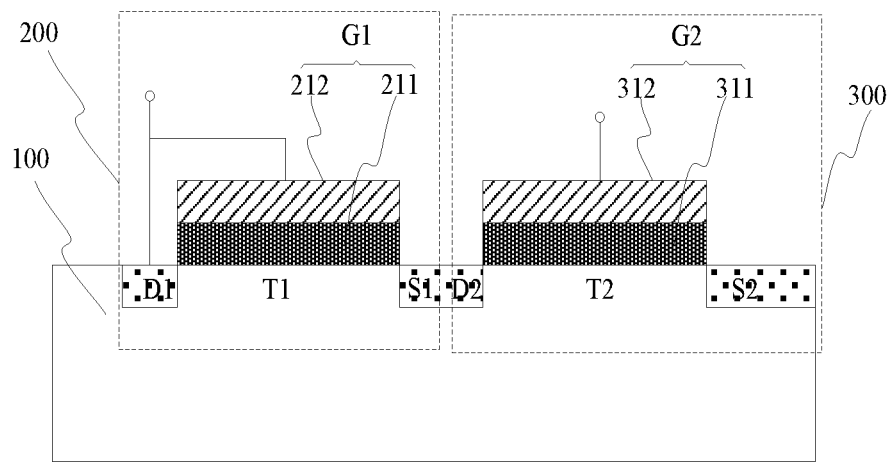
FIG. 2 is a schematic top structure view of another anti-fuse unit structure according to an embodiment of the present disclosure.

Referring to FIG. 1 and FIG. 2, an embodiment of the present disclosure provides an anti-fuse unit structure. The anti-fuse unit structure comprises a substrate 100, an anti-fuse device 200, and a select transistor 300.

The anti-fuse device 200 is formed in the substrate 100 and comprises a first gate structure G1, a first source doped region S1, and a first drain doped region D1, wherein the first gate structure G1 is electrically connected to the first drain doped region D1.

The select transistor 300 is formed in the substrate 100 and matched with the anti-fuse device 200, and comprises a second gate structure G2, a second source doped region S2 and a second drain doped region D2, wherein the second drain doped region D2 is electrically connected to the first source doped region S1.

In this embodiment, by electrically connecting the first gate structure G1 to the first drain doped region D1 of the anti-fuse device 200, the voltage required by the gate during the turn-on may be reduced, so that the anti-fuse device 200 with thin gate oxide may be replaced with the anti-fuse transistor with thick gate oxide. In this way, the distance between the obtained anti-fuse device 200 and the select transistor 300 may be reduced, eliminating the restriction of design rules between gate oxide layers of different thickness. This is conducive to the reduction in the size of the anti-fuse unit structure, and also ensures that the programming voltage at this time is close to that of the anti-fuse device 200 with a thin gate oxide layer structure. In addition, due to the better stability of the thick gate oxide process, more stable programming voltage and fusing resistance are obtained, thereby optimizing the circuit performance of the anti-fuse unit structure.

In this embodiment, the substrate 100 comprises a silicon substrate, an epitaxial silicon substrate, a silicon germanium substrate, a silicon carbide substrate, or a silicon-coated insulating substrate. However, the substrate 100 is not limited thereto. Those skilled in the art may select the type of the substrate 100 according to the semiconductor device to be formed on the substrate 100, so the type of the substrate 100 should not limit the protection scope of the present disclosure. In this embodiment, the substrate 100 is a P-type substrate or a P-type well region, the first source doped region, the first drain doped region, the second source doped region, and the second drain doped regions are all N-type doped regions.

In an embodiment, the first gate structure G1 comprises a first gate dielectric layer 211 and a first gate conductive layer 212; the second gate structure G2 comprises a second gate dielectric layer 311 and a second gate conductive layer 312; wherein the thickness of the first gate dielectric layer 211 is equal to the thickness of the second gate dielectric layer 311, and the thickness of the first gate conductive layer is equal to the thickness of the second gate conductive layer.

It may be understood that, since the thickness of the first gate dielectric layer 211 is equal to the thickness of the second gate dielectric layer 311 and the thickness of the first gate conductive layer is equal to the thickness of the second gate conductive layer, the first gate dielectric layer 211 of the anti-fuse device 200 and the second gate dielectric layer 311 of the select transistor 300 may be fabricated simultaneously and the first gate conductive layer 212 and the second gate conductive layer 312 may be fabricated synchronously, in order to achieve process compatibility, simplify the process flow of the anti-fuse unit structure, and improve the process stability of the fabrication of the first gate dielectric layer 211, and thus improve the stability of the programming voltage and fusing resistance of the first gate dielectric layer 211. In addition, in some other embodiments, the thickness of the first gate dielectric layer 211 may not be equal to the thickness of the second gate dielectric layer 311. For example, the thickness of the first gate dielectric layer 211 is slightly less than the thickness of the second gate dielectric layer 311.

In this embodiment, the first gate dielectric layer 211 is located on the surface of the substrate 100, and the first gate conductive layer 212 is located on a side of the first gate dielectric layer 211 facing away from the substrate 100. The second gate dielectric layer 311 is located on the surface of the substrate 100, and the second gate conductive layer 312 is located on a side of the second gate dielectric layer 311 facing away from the substrate 100. The first gate dielectric layer 211, the first gate conductive layer 212, the second gate dielectric layer 311, and the second gate conductive layer 312 may be formed by various thin film formation methods such as chemical vapor deposition, thermal oxidation, extrapolation, vacuum evaporation, magnetron sputtering, and plasma coating.

Specifically, the first gate dielectric layer 211 of the anti-fuse device 200 and the second gate dielectric layer 311 of the select transistor 300 have the same thickness, and their upper surfaces are flush with each other. Thus, the first gate dielectric layer 211 of the anti-fuse device 200 may be fabricated by the same process flow as the second gate dielectric layer 311 of the select transistor 300, in order to simplify the process flow and reduce the production cost. And, this is also compatible with subsequent processes.

In an embodiment, both the first gate dielectric layer 211 and the second gate dielectric layer 311 are made of a silicon oxide material. It may be understood that, when both the first gate dielectric layer 211 and the second gate dielectric layer 311 are made of a silicon oxide material, it is advantageous to simultaneously fabricate the first gate dielectric layer 211 and the second gate dielectric layer 311 by a single process. This simplifies the process flow and reduces the production cost. In addition, the first gate dielectric layer 211 and the second gate dielectric layer 311 may be made of other insulating materials having a dielectric constant. The first gate dielectric layer 211 and the second gate dielectric layer 311 may be made of different insulating materials.

In an embodiment, the first gate conductive layer 212 is made of one or more of polysilicon, titanium nitride, and metal tungsten.

In this embodiment, the first gate conductive layer 212 is made of polysilicon. In some other embodiments, the first gate conductive layer 212 may be made of titanium nitride, metal tungsten, or a metal composite layer. The metal composite layer has two layers, the upper layer is made of metal tungsten, and the lower layer is made of titanium nitride. Or, the metal composite layer has three layers, the upper layer is made of metal tungsten, the middle layer is made of titanium nitride, and the lower layer is made of polysilicon. The metal tungsten layer can reduce the resistance and capacitance of the gate, and the titanium nitride can prevent the diffusion of metal in the upper layer into polysilicon. In short, the first gate conductive layer 212 may be implemented in a variety of ways, and its implementation is not limited in this embodiment.

In an embodiment, the anti-fuse device 200 further comprises a first channel region T1 formed on the substrate 100 and located between the first source doped region S1 and the first drain doped region D1; and the ion doping concentration of the doped region where the first channel region T1 is located is less than the ion doping concentration of the doped regions where the first drain doped region D1, the first source doped region S1, the second drain doped region D2 and the second source doped region S2 are respectively located.

In this embodiment, the substrate 100 is a P-type substrate or a P-type well region. By doping $N^+$-type ions in the substrate 100, a source doped region, a drain doped region and a first channel region T1 can be formed. The doped regions where the first drain doped region D1, the first source doped region S1, the second drain doped region D2, and the second source doped region S2 are respectively located are heavily doped regions. The surface contact resistance may be reduced. The first channel region T1 is a lightly doped channel region. When a high voltage is applied to the anti-fuse device 200, hot carriers will be generated in the first channel region T1. When the energy of hot carriers exceeds a certain threshold, impact ionization occurs. The electron-hole pairs produced by impact ionization will produce more electron-hole pairs, resulting in the avalanche effect. Some of the hot carriers have high kinetic energy to go over the barrier between the substrate 100 in the first channel region T1 and the first gate dielectric layer 211, thus to be injected into the first gate dielectric layer 211 near the drain end. These injected hot carriers will damage the insulating properties of the first gate dielectric layer 211, thereby breaking down the first gate dielectric layer 211. In addition, the doped regions where the first channel region T1, the first drain doped region D1, the first source doped region S1, the second drain doped region D2, and the second source doped region S2 are respectively located may have the same ion doping concentration, and the ion doping concentration of each doped region is not limited in this embodiment.

It may be understood that the ion doping concentration of the first channel region T1, the first drain doped region D1, the first source doped region S1, the second drain doped region D2, and the second source doped region S2 will affect the breakdown voltage of the anti-fuse device 200 and the on-resistance after the anti-fuse device 200 is broken down. Therefore, the ion concentration of the doped region where each structure is located should be set according to actual needs. In addition, the second channel region T2 formed between the second drain doped region D2 and the second source doped region S2 may be lightly doped or may not be doped. In this embodiment, the second channel region T2 is not doped.

In an embodiment, the first source doped region S1 and the second drain doped region D2 at least partially overlap. In this embodiment, the first source doped region S1 and the second drain doped region D2 completely overlap, that is, share a same doped region. It may be understood that, when the first source doped region S1 of the anti-fuse device 200 and the second drain doped region D2 of the select transistor 300 partially or completely overlap, the connecting wire between the first source doped region S1 and the second drain doped region D2 may be omitted. This reduces the area of the doped region, thereby reducing the size of the anti-fuse unit structure.

Figure 3:
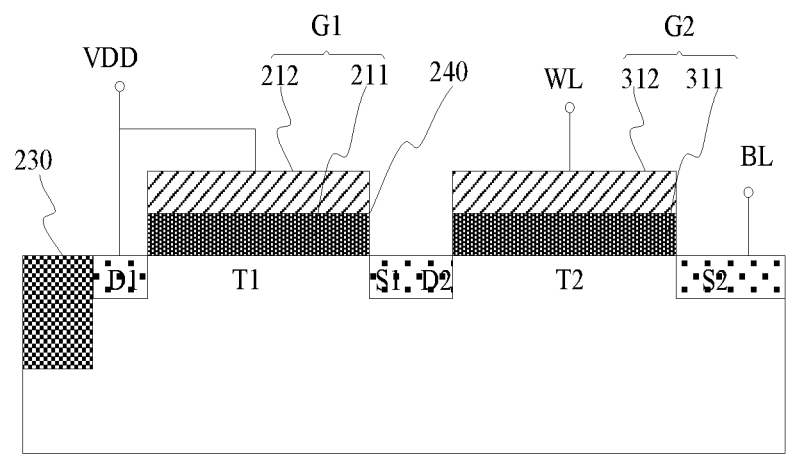
FIG. 3 is a schematic cross-sectional structure view of still another anti-fuse unit structure according to an embodiment of the present disclosure.

In an embodiment, the anti-fuse device 200 further comprises an isolation region 230 formed on the substrate 100 and located on a side of the first drain doped region D1 away from the first source doped region S1, as shown in FIG. 3. It may be understood that the provision of the isolation region can isolate the anti-fuse unit structure from other devices, so as to reduce mutual interference between devices. The isolation region 230 may be a trench structure filled with an insulating material. In this embodiment, a shallow trench isolation structure may be used as the isolation region 230, and the shallow trench isolation structure may be filled with silicon oxide or silicon nitrogen. In this way, two adjacent devices can be effectively isolated.

In an embodiment, the first gate structure is electrically connected to a breakdown voltage VDD, the second gate structure is electrically connected to a word line signal WL, and the second source doped region is electrically connected to a bit line signal BL. It may be understood that, during the programming process, a word line is selected and a word line signal WL is provided thereto, a bit line signal terminal is grounded, and a breakdown voltage VDD is applied to the first gate structure; when the applied breakdown voltage VDD is greater than the breakdown voltage VDD of the first gate dielectric layer of the anti-fuse device, the first gate dielectric layer is broken down, thereby realizing programming.

Figure 4:
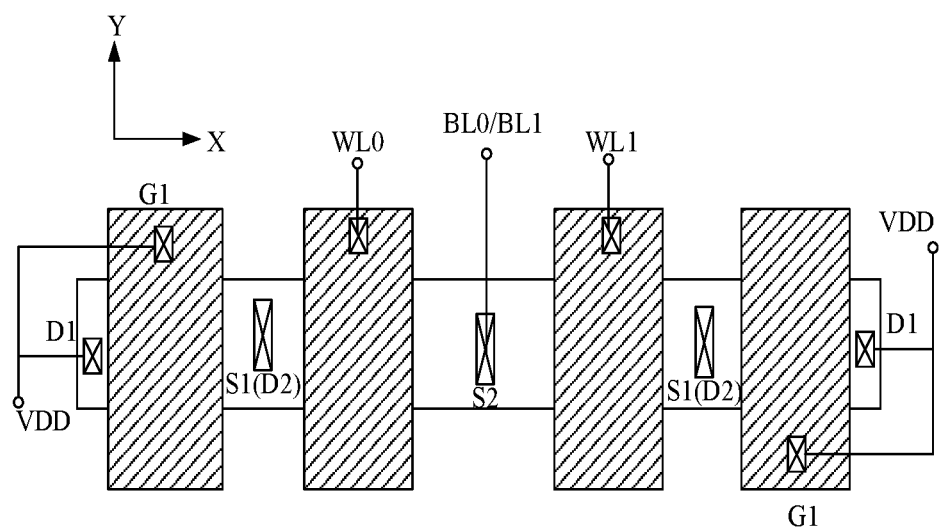
FIG. 4 is a schematic top structure view of an anti-fuse unit combination according to an embodiment of the present disclosure.
Figure 5:
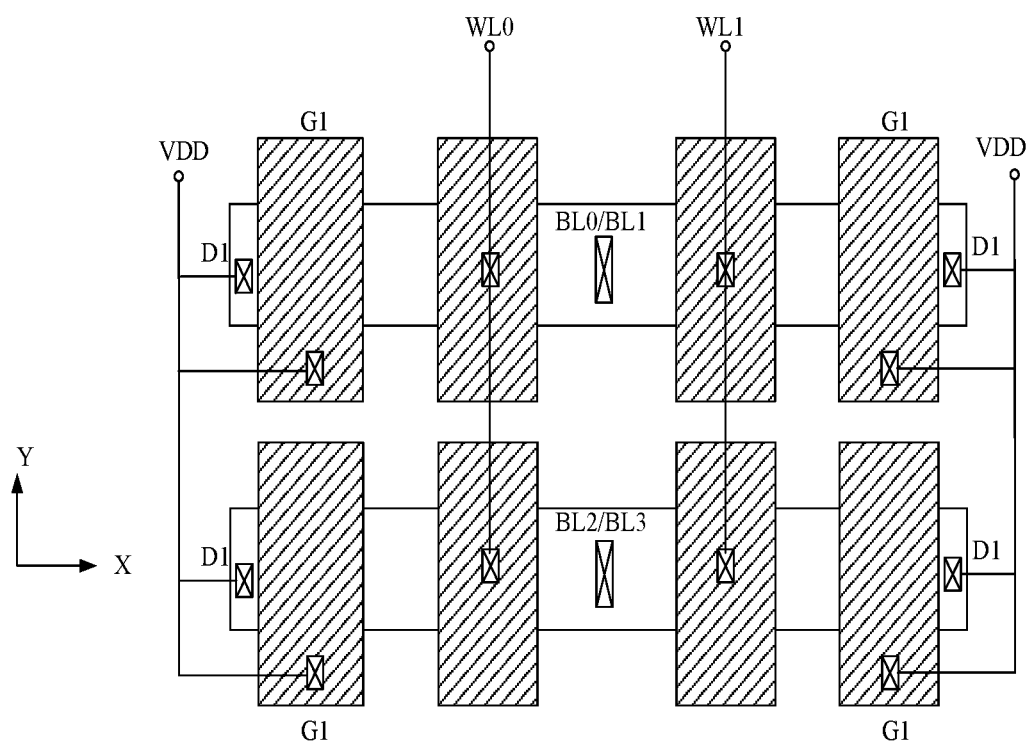
FIG. 5 is a schematic top structure view of an anti-fuse array according to an embodiment of the present disclosure.

Based on the same inventive concept, an embodiment of the present disclosure further provides an anti-fuse array. The anti-fuse array comprises a plurality of anti-fuse unit combinations arranged in an array. Referring to FIGS. 4 and 5, each of the anti-fuse unit combinations comprises two symmetrically arranged anti-fuse unit structures, wherein the anti-fuse unit structure is the anti-fuse unit structure described in any of the above embodiments.

In an embodiment, the two anti-fuse unit structures in one anti-fuse unit combination are axially symmetrical or centrally symmetrical. It may be understood that, when the two anti-fuse unit structures in the same anti-fuse unit combination are axially symmetrical or centrally symmetrical, the area of the anti-fuse array can be effectively reduced. In addition, the two anti-fuse unit structures in the same anti-fuse unit combination may be arranged in the same direction.

In an embodiment, the second source doped regions S2 of the two select transistors 300 located in one anti-fuse unit combination at least partially overlap. In this embodiment, the second source doped regions S2 of the two select transistors 300 located in one anti-fuse unit combination completely overlap, that is, share a second source doped region S2. It may be understood that, when the second source doped regions S2 of the two select transistors 300 in the same anti-fuse unit combination partially or completely overlap, the area of the doped region can be reduced and thus the size of the anti-fuse unit combination can be reduced. In addition, in the anti-fuse unit structure, the first source doped region of the anti-fuse device may at least partially overlap with the second drain doped region of the select transistor, so as to further reduce the area of the doped region and reduce the size of the anti-fuse unit combination.

In an embodiment, all the first gate structures are electrically connected to a breakdown voltage VDD, and the M*N second gate structures arranged side by side in the Y direction are electrically connected to a same word line signal WL, the second source doped regions in the different anti-fuse unit combinations are electrically connected to different bit line signals BL; wherein, the direction from the first source doped region to the first drain doped region of the same anti-fuse unit structure is the X direction that is perpendicular to the Y direction, and the number of the word line signals of the anti-fuse array is 2*M, the number of the bit line signals of the anti-fuse array is N, where the M is a positive integer and the N is a positive even number. In this embodiment, the anti-fuse array is a 2×2 anti-fuse unit array, that is, it comprises two anti-fuse unit combinations arranged in the Y direction, and each anti-fuse unit combination comprises two symmetrically arranged anti-fuse unit structures which are controlled and driven by total two word line signals (WL0 and WL1) and two bit line signals (BL0/BL1 or BL2/BL3), wherein, all the first gate structures G1 are electrically connected to a breakdown voltage VDD, the second gate structures G2 in a same column in the Y direction are electrically connected to a same word line signal WL0 or WL1, and the second source doped regions S2 in a same row in the X direction are electrically connected to a same bit line Signal BL0/BL1 or BL2/BL3. In a 2×2 anti-fuse unit array, the second source doped regions S2 in a same row overlap.

Various technical features of the above embodiments can be arbitrarily combined. For simplicity, all possible combinations of various technical features of the above embodiments are not described. However, all those technical features shall be included in the protection scope of the present disclosure if not conflict.

The embodiments described above are merely some implementations of the present disclosure. Although those embodiments have been described in specific details, they are not construed as any limitation to the scope of the present disclosure. It should be noted that, for a person of ordinary skill in the art, a number of variations and improvements may be made without departing from the concept of the present disclosure, and those variations and improvements should be regarded as falling into the protection scope of the present disclosure. Therefore, the protection scope of the present disclosure should be subject to the appended claims.

What is claimed is:

1. An anti-fuse unit structure, comprising:
   a substrate;
   an anti-fuse device, formed in the substrate, comprising a first gate structure, a first source doped region, and a first drain doped region, wherein the first gate structure is electrically connected to the first drain doped region; and
   a select transistor, formed in the substrate and matched with the anti-fuse device, comprising a second gate structure, a second source doped region and a second drain doped region, wherein the second drain doped region is electrically connected to the first source doped region;
   wherein the first gate structure comprises a first gate dielectric layer and a first gate conductive layer, the first gate conductive layer is made of a metal composite layer; and
   wherein the metal composite layer has three layers, an upper layer is made of metal tungsten, a middle layer is made of titanium nitride, and a lower layer is made of polysilicon.

2. The anti-fuse unit structure according to claim 1, wherein the second drain doped region and the first source doped region are at least partially overlap.

3. The anti-fuse unit structure according to claim 1, wherein the substrate is a P-type substrate or a P-type well region, the first source doped region, the first drain doped region, the second source doped region and the second drain doped region are all N-type doped regions.

4. The anti-fuse unit structure according to claim 1, wherein the second gate structure comprises a second gate dielectric layer and a second gate conductive layer; and
   a thickness of the first gate dielectric layer is equal to a thickness of the second gate dielectric layer, and a thickness of the first gate conductive layer is equal to a thickness of the second gate conductive layer.

5. The anti-fuse unit structure according to claim 4, wherein the second gate conductive layer comprises a polysilicon layer, a titanium nitride layer, and a metal tungsten layer.

6. The anti-fuse unit structure according to claim 1, wherein the first gate structure is electrically connected to a breakdown voltage, the second gate structure is electrically connected to a word line signal, and the second source doped region is electrically connected to a bit line signal.

7. The anti-fuse unit structure according to claim 1, wherein the anti-fuse device further comprises an isolation region formed in the substrate and located at a side of the first drain doped region away from the first source doped region.

8. The anti-fuse unit structure according to claim 1, wherein the substrate is a silicon substrate, an epitaxial silicon substrate, a silicon germanium substrate, a silicon carbide substrate, or a silicon-coated insulating substrate.

9. The anti-fuse unit structure according to claim 4, wherein the first gate dielectric layer is located on a surface of the substrate, and the first gate conductive layer is located at a side of the first gate dielectric layer facing away from the substrate, the second gate dielectric layer is located on the surface of the substrate, and the second gate conductive layer is located at a side of the second gate dielectric layer facing away from the substrate.

10. The anti-fuse unit structure according to claim 9, wherein the first gate dielectric layer and the second gate dielectric layer are both made of a silicon oxide material.

11. The anti-fuse unit structure according to claim 1, wherein the anti-fuse device further comprises a first channel region formed on the substrate and located between the first source doped region and the first drain doped region;
    wherein, an ion doping concentration of a doped region where the first channel region is located is less than ion doping concentrations of the doped regions where the first drain doped region, the first source doped region, the second drain doped region and the second source doped region are respectively located.

12. The anti-fuse unit structure according to claim 11, wherein the doped regions where the first drain doped region, the first source doped region, the second drain doped region, and the second source doped region are respectively located are heavily doped regions.

13. An anti-fuse array, comprising a plurality of anti-fuse unit combinations arranged in an array, each of the anti-fuse unit combinations comprising two symmetrically arranged anti-fuse unit structures each comprising the anti-fuse unit structure according to claim 1.

14. The anti-fuse array according to claim 13, wherein two anti-fuse unit structures in one of the anti-fuse unit combinations are axially symmetrical or centrally symmetrical.

15. The anti-fuse array according to claim 13, wherein second source doped regions of two select transistors in one of the anti-fuse unit combinations at least partially overlap.

16. The anti-fuse array according to claim 13, wherein all first gate structures are electrically connected to a breakdown voltage, and M*N second gate structures arranged side by side in a Y direction are electrically connected to a same word line signal, second source doped regions in different anti-fuse unit combinations are electrically connected to different bit line signals;
    wherein, a direction from the first source doped region to the first drain doped region of a same anti-fuse unit structure is a X direction that is perpendicular to the Y direction, and a number of word line signals of the anti-fuse array is 2*M, a number of the bit line signals of the anti-fuse array is N, where the M is a positive integer and the N is a positive even number.

17. An anti-fuse array, comprising a plurality of anti-fuse unit combinations arranged in an array, each of the anti-fuse unit combinations comprising two symmetrically arranged anti-fuse unit structures each comprising an anti-fuse unit structure;
    wherein the anti-fuse unit structure, comprising: a substrate; an anti-fuse device, formed in the substrate, comprising a first gate structure, a first source doped region, and a first drain doped region, wherein the first gate structure is electrically connected to the first drain doped region; and a select transistor, formed in the substrate and matched with the anti-fuse device, comprising a second gate structure, a second source doped region and a second drain doped region, wherein the second drain doped region is electrically connected to the first source doped region;
    wherein all first gate structures are electrically connected to a breakdown voltage, and M*N second gate structures arranged side by side in a Y direction are electrically connected to a same word line signal, second source doped regions in different anti-fuse unit combinations are electrically connected to different bit line signals;

wherein, a direction from the first source doped region to the first drain doped region of a same anti-fuse unit structure is a X direction that is perpendicular to the Y direction, and a number of word line signals of the anti-fuse array is 2*M, a number of the bit line signals of the anti-fuse array is N, where the M is a positive integer and the N is a positive even number;

wherein two anti-fuse unit structures in one of the anti-fuse unit combinations are axially symmetrical or centrally symmetrical; or wherein second source doped regions of two select transistors in one of the anti-fuse unit combinations at least partially overlap.

\* \* \* \* \*